(12) United States Patent
Somayajula

(10) Patent No.: US 7,224,299 B2
(45) Date of Patent: May 29, 2007

(54) SYSTEM AND METHOD FOR ADJUSTING DITHER IN A DELTA SIGMA MODULATOR

(75) Inventor: Shyam S. Somayajula, Austin, TX (US)

(73) Assignee: NXP, B.V., Eindhoven (NL)

(*) Notice: Subject to any disclaimer, the term of this patent is extended or adjusted under 35 U.S.C. 154(b) by 0 days.

(21) Appl. No.: 11/242,110

(22) Filed: Sep. 30, 2005

(65) Prior Publication Data
US 2007/0075885 A1    Apr. 5, 2007

(51) Int. Cl.
    H03M 1/20    (2006.01)
(52) U.S. Cl. .................... 341/131; 341/143
(58) Field of Classification Search ............ 341/143, 341/118, 120, 155, 131
    See application file for complete search history.

(56) References Cited

U.S. PATENT DOCUMENTS

| | | | |
|---|---|---|---|
| 5,055,846 A | 10/1991 | Welland | 341/155 |
| 5,835,038 A * | 11/1998 | Nakao et al. | 341/131 |
| 6,061,009 A | 5/2000 | Krone et al. | 341/143 |
| 6,064,326 A | 5/2000 | Krone et al. | 341/143 |
| 6,351,229 B1 * | 2/2002 | Wang | 341/143 |
| 6,408,034 B1 | 6/2002 | Krone et al. | 375/285 |
| 6,661,360 B2 * | 12/2003 | Lambert | 341/131 |
| 2005/0112811 A1 | 5/2005 | Hsu et al. | 438/197 |

FOREIGN PATENT DOCUMENTS

| | | |
|---|---|---|
| EP | 0308982 A2 | 3/1989 |
| EP | 1335543 A2 | 8/2003 |

OTHER PUBLICATIONS

International Search Report and Written Opinion mailed Nov. 28, 2006, PCT/US2006/036609 (11 pgs).

Chris Binan Wang et al "A 113-DB DSD Audio ADC Using a Density -Modulated Dithering Scheme" IEEE Journal of Solid-State circuits, IEEE Service Center, Piscataway, NJ vol. 38, No. 1, Jan. 2003 pp. 114-119, XP001223265.

* cited by examiner

*Primary Examiner*—Brian Young
(74) *Attorney, Agent, or Firm*—Peter Zawilski

(57) ABSTRACT

A delta sigma modulator is provided. The delta sigma modulator comprises quantitizer circuitry configured to generate a digital signal using a first analog signal and dither control circuitry configured to use the digital signal to adjust an amount of dither applied to the first analog signal.

24 Claims, 4 Drawing Sheets

SYSTEM AND METHOD FOR ADJUSTING DITHER IN A DELTA SIGMA MODULATOR

BACKGROUND

A delta sigma modulator is an electronic component configured to output a digital signal to represent an analog input signal. The modulator outputs the digital signal at a logic high value or a logic low value at a relatively high frequency to represent the analog signal. Because the digital signal is highly quantized, the digital signal typically has significant quantization noise. To prevent the quantization noise from adversely affecting the modulator, the modulator is generally designed to shape the frequency response of the quantization noise such that the noise appears outside of a frequency range of interest, i.e., the passband of the modulator.

When used in an analog-to-digital converter (ADC), the digital output of a delta sigma modulator feeds back and is modulated with a reference voltage. Under ideal circumstances, the reference voltage is a constant DC voltage. During the operation of the modulator, however, the reference voltage may pick up electrical interference from other circuitry on the same substrate that is referred to as tones. When the energy of the analog input signal of the modulator is relatively low (e.g., no input signal is applied), the modulator may convolve the tones with out-of-band tones caused by limit cycle oscillations. The convolution may cause the tones to get folded down into spurious tones in the frequency range of interest. The spurious tones may degrade the performance of the modulator. It would be desirable to minimize sensitivity to spurious tones to reduce performance degradation of a delta sigma modulator.

SUMMARY

According to one exemplary embodiment, a delta sigma modulator is provided. The delta sigma modulator comprises quantitizer circuitry configured to generate a digital signal using an analog signal and dither control circuitry configured to use the digital signal to adjust an amount of dither applied to the analog signal.

According to another exemplary embodiment, method is provided that comprises generating a digital output signal in accordance with an analog signal and generating an amount of dither that varies according to the digital output signal.

According to a further exemplary embodiment, system is provided that comprises circuitry configured to use a control signal to generate an amount of dither and second circuitry configured to generate the control signal using a digital output signal generated by a delta sigma modulator in response to an analog input signal.

According to another exemplary embodiment, communications device is provided. The communications device comprises an antenna configured to receive an analog input signal, a mobile communications sub-system configured to communicate with a remote host using the antenna and including an analog-to-digital converter (ADC), and an input/output sub-system configured to communicate with the mobile communications sub-system. The ADC includes a delta sigma modulator configured to generate a digital output signal using the analog input signal, and the delta sigma modulator includes dither control circuitry configured to us the digital output signal to generate an amount of dither.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

As described herein, a delta sigma modulator is provided that generates a digital output signal in accordance with an analog input signal. The low frequency content of the digital output signal varies with the strength of the analog input signal. The modulator includes dither control circuitry that is configured to adjust the amount of dither applied to the modulator in accordance with the digital output signal. The dither control circuitry decreases the amount of dither in response to an increase in low frequency content of the digital output signal, and the dither control circuitry increases the amount of dither in response to a decrease in low frequency content of the digital output signal. In particular, the dither control circuitry increases the amount of dither in response to low signal strengths of the analog input signal, e.g., idle channel conditions, as determined using the low frequency content of the digital output signal.

By adjusting the amount of dither applied to the analog input of a quantizer, the dither control circuitry prevents the modulator from saturating under relatively high signal strengths of the analog input signal and prevents tones caused by limit cycle oscillations from folding down into spurious tones in the frequency range of interest under relative low signal strengths of the analog input signal. Also, the dither control circuitry prevents quantization noise from degrading the performance of the modulator at high input signal levels.

Figure 1:
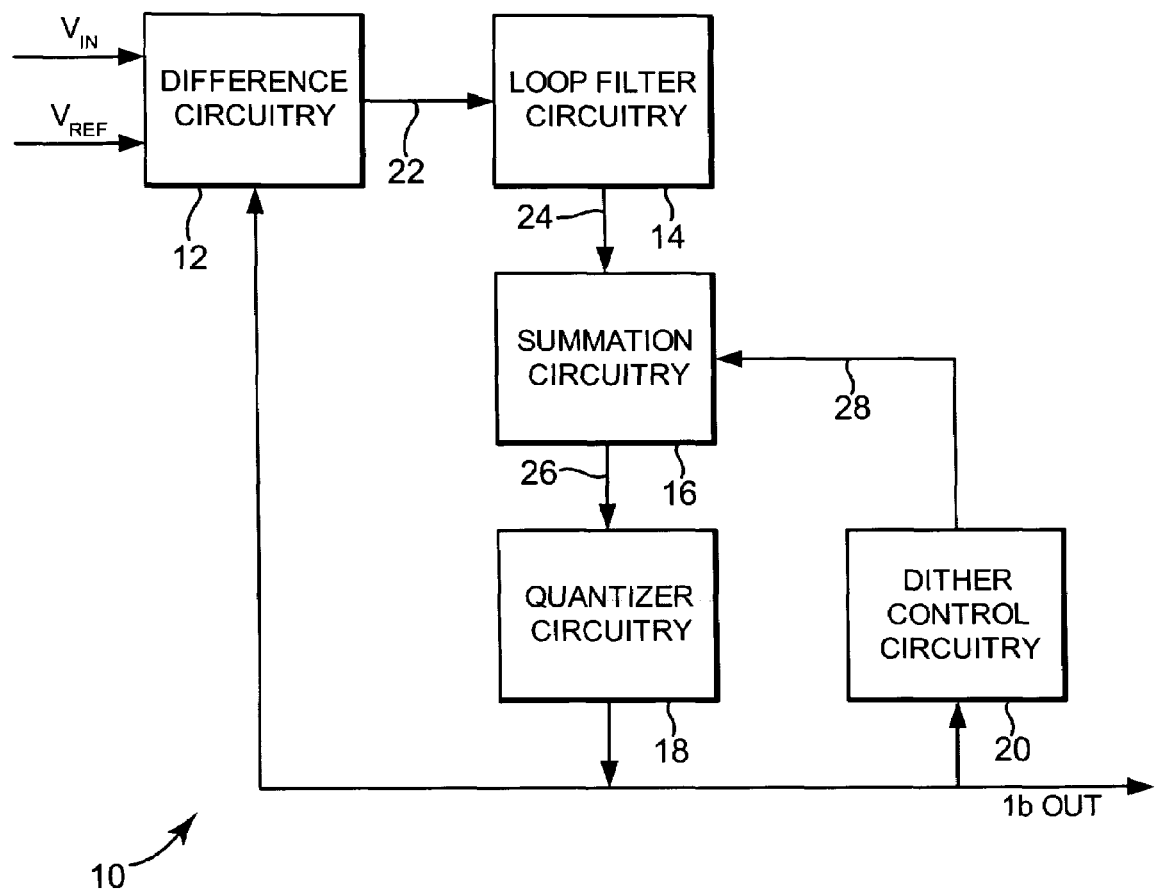
FIG. 1 is a block diagram illustrating one embodiment of a delta sigma modulator.

FIG. 1 is a block diagram illustrating one embodiment of a delta sigma modulator 10. Modulator 10 includes difference circuitry 12, loop filter circuitry 14, summation circuitry 16, quantizer circuitry 18, and dither control circuitry 20.

Modulator 10 receives an analog input signal, $V_{IN}$, and generates a digital output signal, 1b OUT, in accordance with the analog input signal. Modulator 10 generates the digital output signal at using logic high (e.g., 1) and logic low (e.g., −1) values at a relatively high frequency to represent the analog signal. The frequency of the digital output signal varies with the strength of the analog input signal. Modulator 10 is configured to continuously adjust the amount of dither applied to the digital output signal according to low frequency content of the digital output signal. In particular, modulator 10 increases the amount of dither in response to low signal strengths of the analog input signal, e.g., idle channel conditions, as determined using the low frequency content of the digital output signal.

Difference circuitry 12 receives analog input signal, $V_{IN}$, and a reference voltage signal, $V_{REF}$. Difference circuitry 12 also receives the digital output signal generated by quantizer circuitry 18. Difference circuitry 12 derives an analog signal 22 from the analog input signal and the reference voltage signal. Difference circuitry 12 modulates the reference voltage signal using the digital output signal and generates analog signal 22 that represents a difference between the analog input signal and the modulated reference voltage signal. Difference circuitry 12 provides analog signal 22 to loop filter circuitry 14.

The reference voltage signal received by difference circuitry 12 may include noise caused by other electrical components that are electrically connected or in close proximity to modulator 10. For example, when modulator 10 is used in a mobile communications sub-system, noise may be generated by a universal asynchronous receiver-transmitter (UART), processing circuitry, clock circuitry, or voltage conversion circuitry. The noise may include energy created by harmonic oscillations (e.g., clock signals) or electromagnetic coupling of closely spaced circuitry components. Because difference circuitry 12 modulates the reference voltage signal with the digital output signal, noise on the reference voltage signal may affect the generation of analog signal 22 during idle channel conditions.

Loop filter circuitry 14 receives analog signal 22 and derives analog signal 24 from analog signal 22. Loop filter circuitry 14 generates analog signal 24 using analog signal 22 according to any suitable filtering function. Loop filter circuitry 14 may include any number of filters, integrators, and feedback loops. In one embodiment, loop filter circuitry 14 comprises a third order system with one feedback loop. Loop filter circuitry 14 provides analog signal 24 to summation circuitry 16.

Summation circuitry 16 receives analog signal 24 from loop filter circuitry and an analog dither signal 28 from dither control circuitry 20. Analog dither signal 28 includes dither generated by dither control circuitry 20. Summation circuitry 16 derives an analog signal 26 from analog signal 24 and analog dither signal 28. Summation circuitry 16 combines analog signal 24 and analog dither signal 28, e.g., by adding analog signal 24 and analog dither signal 28, to apply the dither to analog signal 24 and generate analog signal 26. Summation circuitry 16 provides analog signal 26 to quantizer circuitry 18.

Quantizer circuitry 18 receives analog signal 26 from summation circuitry 16. Quantizer circuitry 18 derives the digital output signal from analog signal 26. Quantizer circuitry 18 converts analog signal 26 to a series of logic high (e.g., 1) and logic low (e.g., −1) values at a relatively high frequency to generate the digital output signal, 1b OUT. In the embodiment of FIG. 1, the digital output signal comprises a one bit output signal. Quantizer circuitry 18 provides the digital output signal to difference circuitry 12 and dither control circuitry 20.

Dither control circuitry 20 receives the digital output signal and generates analog dither signal 28 in accordance with the digital output signal. Digital control circuitry 20 derives analog dither signal 28 from the digital output signal. Digital control circuitry 20 uses the digital output signal to adjust analog dither signal 28. As noted above, analog dither signal 28 includes an amount of dither that is combined with analog signal from loop filter circuitry 14. Dither control circuitry 20 adjusts the amount of dither that is generated using the digital output signal such that the dither varies according to the digital output signal.

In one embodiment, dither control circuitry 20 generates the dither according to low frequency content of the digital output signal. As noted above, the low frequency content of the digital output signal varies with the strength, e.g., the amplitude, of the analog input signal. As the strength of the analog input signal increases, the low frequency content of the digital output signal decreases. In addition, the low frequency content of the digital output signal increases as the strength of the analog input signal decreases. Accordingly, dither control circuitry 20 increases the amount of dither provided to summation circuitry 16 as the low frequency content of the digital output signal decreases and decreases the amount of dither provided to summation circuitry 16 as the low frequency content of the digital output signal increases. In particular, dither control circuitry 20 increases the amount of dither in response to low signal strengths of the analog input signal such as idle channel conditions.

By decreasing the amount of dither as the low frequency content of the digital output signal increases, dither control circuitry 20 decreases the dither provided to summation circuitry 16 as the strength of the analog input signal increases. As a result, dither circuitry 20 may prevent modulator 10 from saturating during periods of relatively high signal strengths of the analog input signal.

By increasing the amount of dither as the low frequency content of the digital output signal decreases, dither control circuitry 20 increases the dither provided to summation circuitry 16 as the strength of the analog input signal decreases. As a result, dither control circuitry 20 may prevent tones caused by limit cycle oscillations from folding down into spurious tones in the frequency range of interest of modulator 10 under relatively low signal strengths of the analog input signal. The limit cycle oscillations may occur as a result of noise on the reference voltage signal during idle channel conditions as described above.

In one embodiment, dither control circuitry 20 generates the dither in accordance with a current value and a previous value of the digital output signal. In this embodiment, dither control circuitry 20 decreases the dither if the current and previous values are equal and increases the dither if the current and previous values are not equal. In other embodiments, dither control circuitry 20 generates the dither in accordance with any number of current and previous values of the digital output signal. For example, dither control circuitry 20 may adjust the dither according to an average or other function of a number of current and previous values of the digital output signal.

Figure 2:
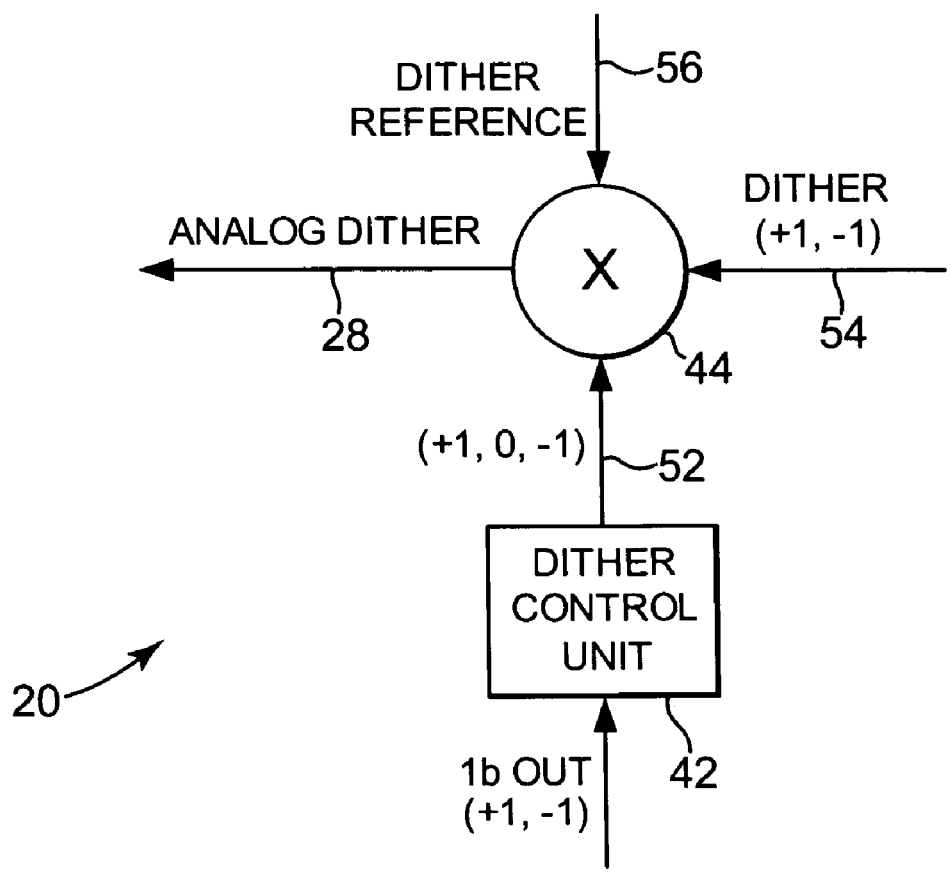
FIG. 2 is a block diagram illustrating one embodiment of dither control circuitry.

FIG. 2 is a block diagram illustrating one embodiment of dither control circuitry 20. In the embodiment of FIG. 2, dither control circuitry 20 includes a dither control unit 42 and a multiplication circuitry 44.

Dither control unit 42 receives the digital output signal, 1b OUT, from quantizer 18 (shown in FIG. 1). Dither control unit 42 generates a digital control signal 52 in accordance with the digital output signal. Dither control unit 42 generates control signal 52 to cause the amount of dither that is generated by multiplication circuitry 44 to be adjusted.

Dither control unit 42 generates control signal 52 in accordance with low frequency content of the digital output signal. Dither control unit 42 generates control signal 52 to cause the amount of dither that is generated by multiplication circuitry 44 to decrease as the low frequency content of the digital output signal increases. Dither control unit 42 also generates control signal 52 to cause the amount of dither that is generated by multiplication circuitry 44 to increase as the low frequency content of the digital output signal decreases. In particular, dither control unit 42 generates control signal 52 to cause the amount of dither that is generated by multiplication circuitry 44 to increase in response to low signal strengths of the analog input signal such as idle channel conditions.

In one embodiment, dither control unit 42 generates control signal 52 by comparing a current value and a previous value of the digital output signal. In the example shown in FIG. 2, dither control unit 42 receives logic high values (e.g., +1) and logic low values (e.g., −1) on the digital output signal. Dither control unit 42 generates control signal 52 such that control signal 52 is equal to either the current value or the previous value if the current value and the previous value are not equal (e.g., the current value is +1 and the previous value is −1, or the current value is −1 and the previous value is +1). Dither control unit 42 generates control signal 52 with a +1 value or a −1 value to cause the amount of dither that is generated by multiplication circuitry 44 to increase. Dither control unit 42 also generates control signal 52 such that control signal 52 is equal to zero if the current value and the previous value are equal (e.g., the current value is +1 and the previous value is +1, or the current value is −1 and the previous value is −1). Dither control unit 42 generates control signal 52 with a zero value to cause the amount of dither that is generated by multiplication circuitry 44 to decrease.

In other embodiments, dither control unit 42 generates control signal 52 in accordance with any number of current and previous values of the digital output signal. For example, dither control unit 42 may generate control signal 52 according to an average or other function of a number of current and previous values of the digital output signal.

Multiplication circuitry 44 receives control signal 52 from dither control unit 42. Multiplication circuitry 44 also receives a digital dither signal 54 and a dither reference signal 56. Digital dither signal 54 and dither reference signal 56 may be generated by dither control circuitry 20 or other circuitry coupled to dither control circuitry 20. Digital dither signal 54 provides logic high values (e.g., +1) and logic low values (e.g., −1) to multiplication circuitry 44. Dither reference signal 56 provides an analog signal to multiplication circuitry 44. Multiplication circuitry 44 generates dither in accordance with control signal 52, digital dither signal 54, and dither reference signal 56 and provides the dither to summation circuitry 16 (shown in FIG. 1) using analog dither signal 28.

In one embodiment, multiplication circuitry 44 generates dither by multiplying control signal 52, digital dither signal 54, and dither reference signal 56 together to generate analog dither signal 28. More particularly, multiplication circuitry 44 generates dither by multiplying the logic level values of control signal 52 and digital dither signal 54 with the analog signal of dither reference signal 56 to generate analog dither signal 28. In other embodiments, multiplication circuitry 44 generates dither by combining control signal 52, digital dither signal 54, and dither reference signal 56 in other ways to generate analog dither signal 28.

Figure 3:
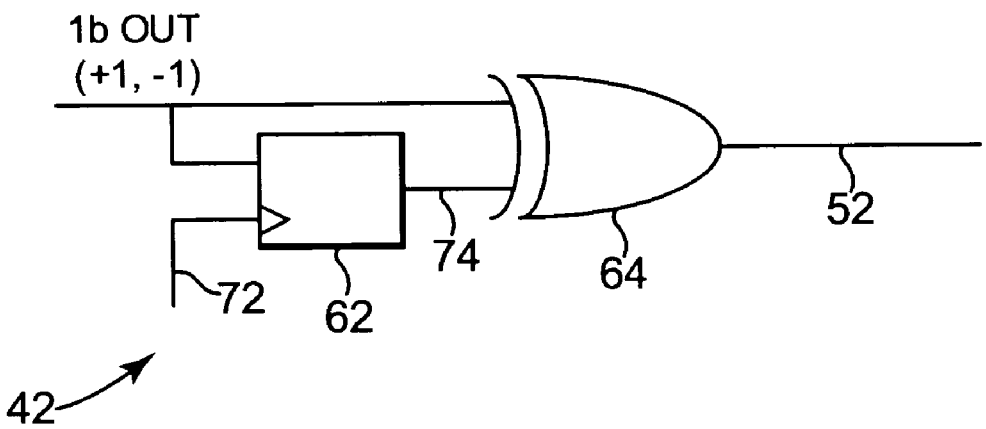
FIG. 3 is a block diagram illustrating one embodiment of a dither control unit.

FIG. 3 is a block diagram illustrating one embodiment of dither control unit 42. In the embodiment of FIG. 3, dither control unit 42 includes a clocked flip-flop 62 and an XOR gate 64. Clocked flip-flop 62 and XOR gate 64 each receive the digital output signal from quantizer 18.

Flip-flop 62 receives a clock signal 72 that causes flip-flop 62 to clock in a current value of the digital output signal with each clock cycle. Clock signal 72 also causes flip-flop 62 to clock out a previous value of the digital output signal, i.e., the value of the digital output signal that is immediately prior to the current value of the digital output signal, with each clock cycle as a signal 74. Flip-flop 62 provides signal 74 to XOR gate 64. XOR gate 64 receives the previous value of the digital output signal on signal 74 and compares the previous value to current value of the digital output signal to generate control signal 52. Using flip-flop 62 and XOR gate 64, dither control unit 42 generates control signal 52 by comparing a current value and a previous value of the digital output signal.

Figure 4:
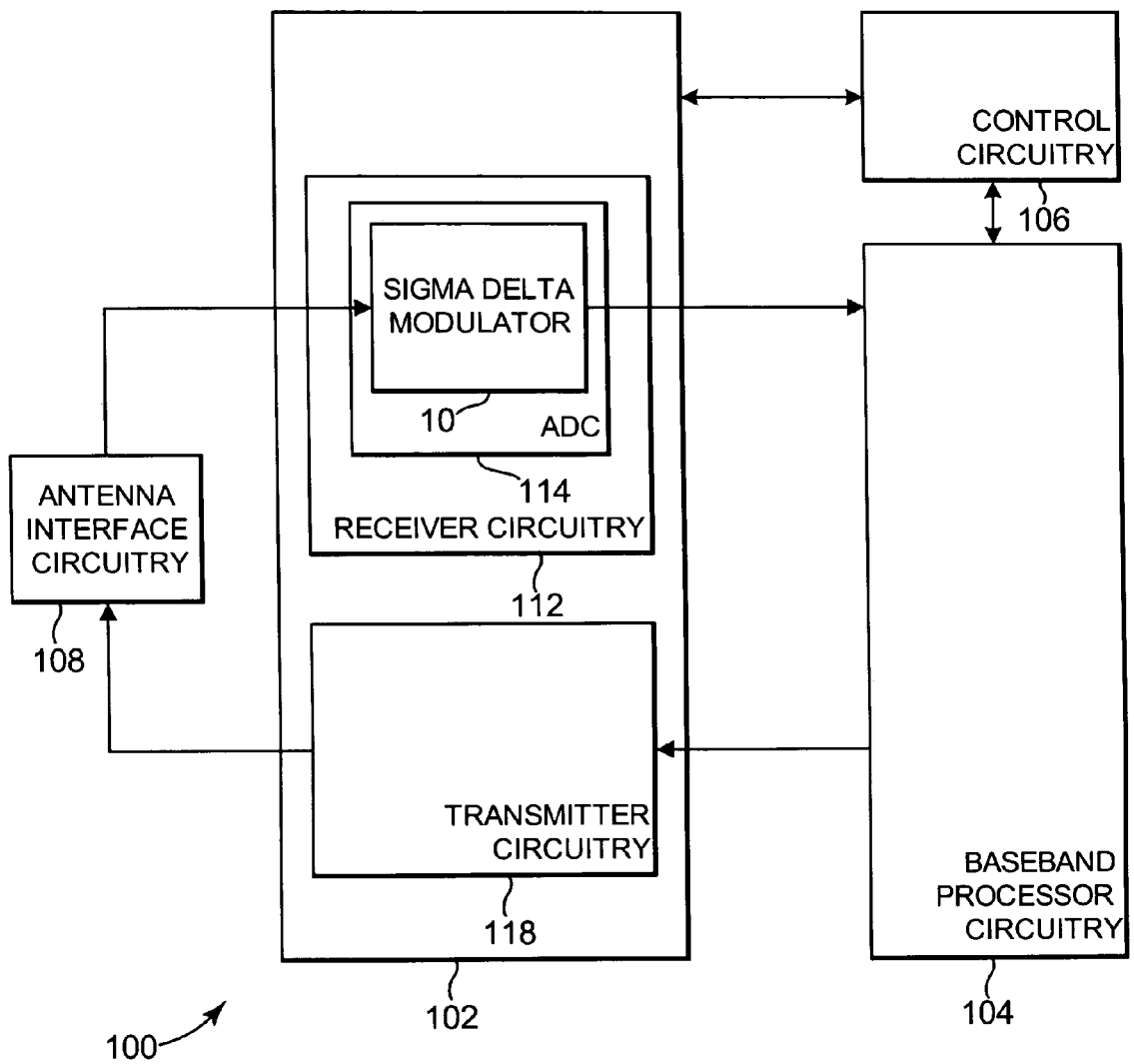
FIG. 4 is a block diagram illustrating one embodiment of a mobile communications sub-system.

FIG. 4 is a block diagram illustrating one embodiment of a mobile communications sub-system 100. Sub-system 100 includes radio-frequency (RF) circuitry 102, baseband processor circuitry 104, control circuitry 106, and antenna interface circuitry 108. RF circuitry 102 includes receiver circuitry 114 and transmitter circuitry 118. Receiver circuitry 114 includes an analog-to-digital converter (ADC) 114, and ADC 114 includes sigma delta modulator 10 as shown in FIG. 1.

Figure 5:
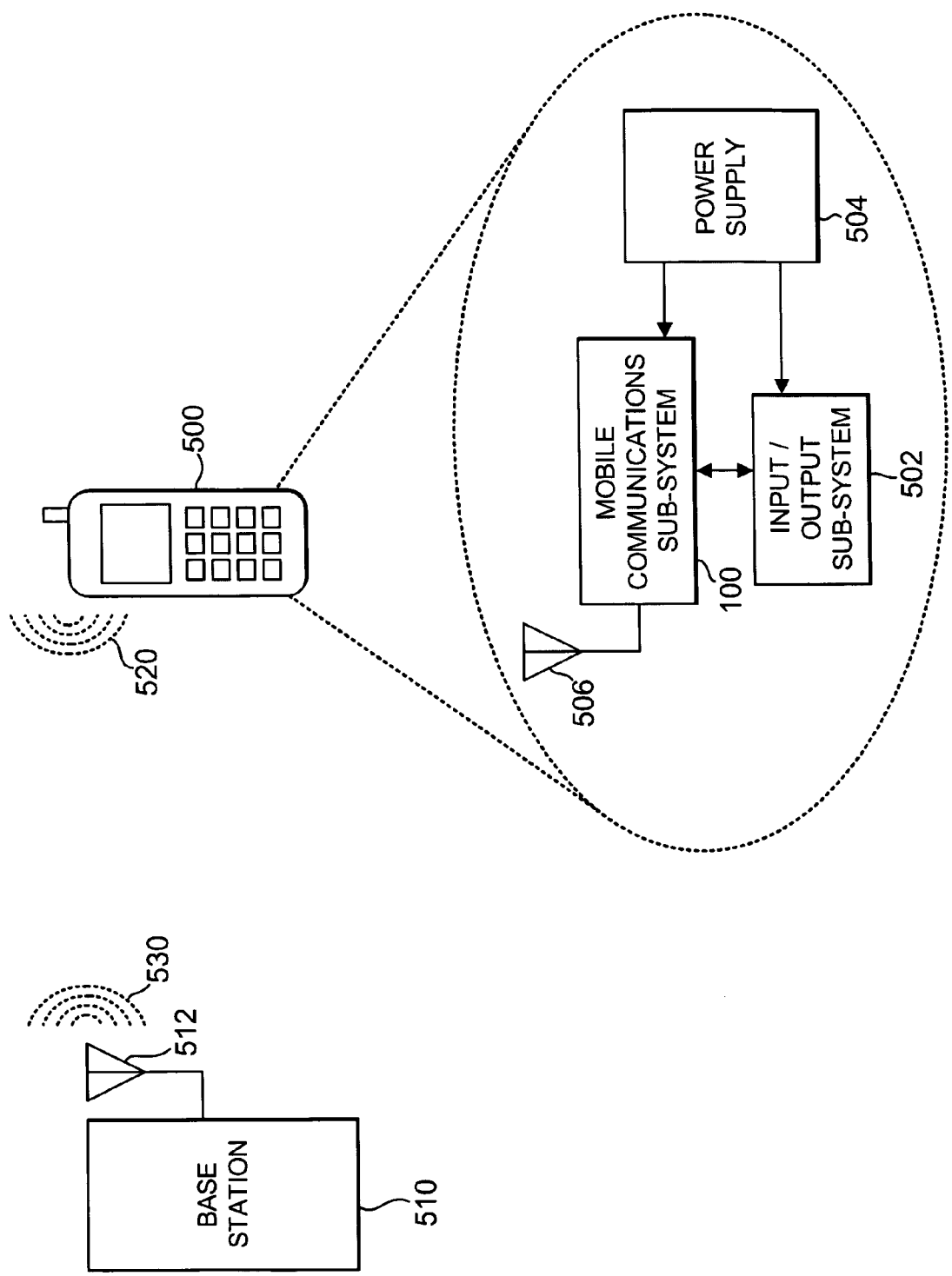
FIG. 5 is a block diagram illustrating one embodiment of a mobile device that includes the mobile communication sub-system shown in FIG. 4.

RF circuitry 102 is configured to transmit and receive information using an antenna (e.g., an antenna 506 as shown in FIG. 5) coupled, directly or indirectly, to antenna interface circuitry 108. The information may comprise voice or data communications, for example.

RF circuitry 102 includes one or more instances of transmitter circuitry 118 configured to transmit information using antenna interface circuitry 108. To transmit information, transmitter circuitry 118 receives digital information to be transmitted from baseband processor circuitry 104, generates an RF signal in accordance with the information, and provides the RF signal to antenna interface circuitry 108 for transmission by an antenna. The RF signal may be amplified by power amplifier circuitry (not shown) prior to being transmitted by the antenna. In one embodiment, each instance of transmitter circuitry 118 is configured to transmit information using one or more frequency bands, e.g., a GSM 850, a EGSM, a PCS, or a DCS band.

RF circuitry 102 also includes one or more instances of receiver circuitry 112 configured to receive information using antenna interface circuitry 108. To receive information, receiver circuitry 112 receives an RF signal that includes information from a remote transmitter (e.g., a base station 510 as shown in FIG. 5) through an antenna, and antenna interface circuitry 108. The RF signal may be filtered by filter circuitry (not shown) prior to being received by receiver circuitry 112. Receiver circuitry 112 amplifies and down-converts the RF signal to convert the RF signal to digital information. In particular, ADC 114 converts the analog RF signal to a digital information using sigma delta modulator 10 as described in additional detail above. Receiver circuitry 112 provides the digital information to baseband processor circuitry 104 for processing. In one embodiment, each instance of receiver circuitry 112 is configured to receive information from one or more frequency bands, e.g., a GSM 850, a EGSM, a PCS, or a DCS band.

Baseband processor circuitry 104 is configured to perform digital baseband processing, e.g., voice and/or data processing, on information to be transmitted by RF circuitry 102 and on information received by RF circuitry 102. Baseband processor circuitry 104 may also be configured to perform digital processing on other information that is not associated with RF circuitry 102, i.e., information that is not to be transmitted by or has not been received from RF circuitry 102.

Control circuitry 106 is configured to control the operation of the components of mobile communications sub-system 100 including RF circuitry 102 and baseband processor circuitry 104. For example, control circuitry 106 is configured to activate and deactivate baseband processor circuitry 104. Control circuitry 106 is also configured to activate and deactivate RF circuitry 102. Control circuitry 106 includes any suitable combination of hardware and/or software components to perform the functions described herein.

Antenna interface circuitry 108 is configured to connect to an antenna, such as antenna 506 shown in FIG. 5, to allow RF signals to be transmitted and received by mobile communications sub-system 100.

Mobile communications sub-system 100 may perform signal processing tasks in a serial or multiplexed manner (e.g., by sharing hardware to perform a variety of tasks), in a parallel manner (e.g., by using dedicated hardware for each signal processing task), or a combination of the two techniques. The choice of signal processing hardware, firmware, and software may depend on the design and performance specifications for a given desired implementation.

FIG. 5 is a block diagram illustrating one embodiment of a mobile communications device 500 that includes mobile communications sub-system 100 as shown in FIG. 4. Mobile communications device 500 may be any type of portable communications device such as a mobile or cellular telephone, a personal digital assistant (PDA), and an audio and/or video player (e.g., an MP3 or DVD player). Mobile communications device 500 includes mobile communications sub-system 100, an input/output sub-system 502, a power supply 504, and an antenna 506.

Input/output sub-system 502 receives information from a user and provides the information to mobile communications sub-system 100. Input/output sub-system 502 also receives information from mobile communications sub-system 100 and provides the information to a user. The information may include voice and/or data communications. Input/output sub-system 502 includes any number and types of input and/or output devices to allow a user provide information to and receive information from mobile communications device 500. Examples of input and output devices include a microphone, a speaker, a keypad, a pointing or selecting device, and a display device.

Power supply 504 provides power to mobile communications sub-system 100, input/output sub-system 502, and antenna 506. Power supply 504 includes any suitable portable or non-portable power supply such as a battery.

Mobile communications sub-system 100 communicates with one or more base stations 510 or other remotely located hosts in radio frequencies using antenna 506. Base stations 510 include one or more antennas 512. Mobile communications sub-system 100 transmits information to one or more base stations 510 or other remotely located hosts in radio frequencies using antenna 506 as indicated by a signal 520. Mobile communications sub-system 100 receives information from a base station 510 in radio frequencies using antenna 506 as indicated by a signal 530 transmitted with one or more antennas 512. In other embodiments, mobile communications sub-system 100 communicates with base stations 510 using other frequency spectra.

In the above embodiments, a variety of circuit and process technologies and materials may be used to implement communication apparatus according to the invention. Examples of such technologies include metal oxide semiconductor (MOS), p-type MOS (PMOS), n-type MOS (NMOS), complementary MOS (CMOS), silicon-germanium (SiGe), gallium-arsenide (GaAs), silicon-on-insulator (SOI), bipolar junction transistors (BJTs), and a combination of BJTs and CMOS (BiCMOS).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A delta sigma modulator comprising:
   quantizer circuitry configured to generate a digital signal using a first analog signal; and
   dither control circuitry configured to use the digital signal to adjust an amount of dither applied to the first analog signal;
   wherein the dither control circuitry is configured to increase the amount of dither applied to the first analog signal in response to a decrease in low frequency content of the digital signal, and wherein the dither control circuitry is configured to decrease the amount of dither applied to the first analog signal in response to an increase in the low frequency content of the digital signal.

2. The delta sigma modulator of claim 1 wherein the dither control circuitry is configured to adjust the amount of dither applied to the first analog signal by comparing a first value of the digital signal to a second value of the digital signal.

3. The delta sigma modulator of claim 2 wherein the dither control circuitry is configured to decrease the amount of dither applied to the first analog signal in response to the first value being equal to the second value.

4. The delta sigma modulator of claim 2 wherein the dither control circuitry is configured to increase the amount of dither applied to the first analog signal in response to the first value being unequal to the second value.

5. The delta sigma modulator of claim 1 wherein the dither control circuitry is configured to derive the amount of dither from a dither signal, a dither reference, and the digital signal.

6. The delta sigma modulator of claim 1 further comprising:
   loop filter circuitry configured to generate a second analog signal; and
   summation circuitry configured to derive the first analog signal from the second analog signal and the amount of dither.

7. The delta sigma modulator of claim 6 further comprising:
   difference circuitry configured to derive a third analog signal from an input signal, a reference signal, and the digital signal;

wherein the loop filter circuitry is configured to use the third analog signal to generate the second analog signal.

8. The delta sigma modulator of claim 6 wherein the loop filter circuitry comprises a plurality of filters.

9. The delta sigma modulator of claim 6 wherein the loop filter circuitry comprises a plurality of integrators.

10. A method comprising:
generating a first analog signal using loop filter circuitry;
generating a digital output signal in accordance with the first analog signal;
generating an amount of dither that varies in accordance with the digital output signal; and
generating the amount of dither in accordance with at least a current value and a previous value of the digital output signal.

11. The method of claim 10 further comprising:
generating the digital output signal using the amount of dither.

12. The method of claim 11 further comprising:
adding the amount of dither to the first analog signal to generate the digital output signal.

13. The method of claim 10 further comprising:
generating the amount of dither in accordance with low frequency content of the digital output signal.

14. The method of claim 10 further comprising:
generating the digital output signal using a quantizer.

15. The method of claim 10 further comprising:
generating a second analog signal in accordance with an input voltage, a reference voltage, and the digital output signal; and
generating the first analog signal in accordance with the second analog signal.

16. The method of claim 15 further comprising:
increasing the amount of dither in response to a decrease in the input voltage.

17. A system comprising:
first circuitry configured to use a control signal to generate an amount of dither;
second circuitry configured to generate the control signal using a digital output signal generated by a delta sigma modulator in response to an analog input signal; and
wherein the second circuitry is configured to generate the control signal by comparing a current value of the digital output signal and a previous value of the digital output signal, and wherein the first circuitry is configured to generate the amount of dither using the control signal, a reference signal, and a dither signal.

18. The system of claim 17 wherein the second circuitry is configured to generate the control signal in accordance with low frequency content of the digital output signal.

19. A communications device comprising:
an antenna configured to receive an analog input signal that includes a radio frequency (RF) signal;
a mobile communications sub-system configured to communicate with a remote host using the antenna and including an analog-to-digital converter (ADC); and
an input/output sub-system configured to communicate with the mobile communications sub-system;
wherein the ADC includes a delta sigma modulator configured to generate a digital output signal using the analog input signal, and wherein the delta sigma modulator includes dither control circuitry configured to use the digital output signal to generate an amount of dither.

20. The communications device of claim 19 wherein the delta sigma modulator configured to generate the digital output signal using the amount of dither.

21. A delta sigma modulator comprising:
loop filter circuitry configured to generate a first analog signal;
quantitizer circuitry configured to generate a digital signal using first analog signal; and
dither control circuitry configured to use the digital signal to adjust an amount of dither applied to the first analog signal;
wherein the dither control circuitry is configured to adjust the amount of dither applied to the first analog signal by comparing a first value of the digital signal to a second value of the digital signal.

22. The method of claim 10 further comprising:
decreasing the amount of dither applied to the first analog signal in response to the current value being equal to the previous value; and
increasing the amount of dither applied to the first analog signal in response to the current value not being equal to the previous value.

23. The system of claim 17 wherein the second circuitry is configured to generate the control signal to cause a decrease in the amount of dither in response to the current value and the previous value being equal and an increase in the amount of dither in response to the current value and the previous value not being equal.

24. The communications device of claim 19 wherein the dither control circuitry is configured to increase the amount of dither in response to a decrease in low frequency content of the digital signal, and wherein the dither control circuitry is configured to decrease the amount of dither in response to an increase in the low frequency content of the digital signal.

* * * * *